US010302712B2

(12) United States Patent
Yuan et al.

(10) Patent No.: US 10,302,712 B2
(45) Date of Patent: May 28, 2019

(54) MAGNETIC FIELD SENSING APPARATUS

(71) Applicants: Fu-Te Yuan, New Taipei (TW);
Meng-Huang Lai, New Taipei (TW)

(72) Inventors: Fu-Te Yuan, New Taipei (TW);
Meng-Huang Lai, New Taipei (TW)

(73) Assignee: iSentek Inc., New Taipei (TW)

( * ) Notice: Subject to any disclaimer, the term of this patent is extended or adjusted under 35 U.S.C. 154(b) by 84 days.

(21) Appl. No.: 15/791,422

(22) Filed: Oct. 24, 2017

(65) Prior Publication Data
US 2018/0128887 A1 May 10, 2018

Related U.S. Application Data

(60) Provisional application No. 62/419,957, filed on Nov. 9, 2016.

(30) Foreign Application Priority Data

Aug. 9, 2017 (TW) .............................. 106126810 A

(51) Int. Cl.
G01R 33/09 (2006.01)
G01R 33/00 (2006.01)

(52) U.S. Cl.
CPC ....... G01R 33/096 (2013.01); G01R 33/0023 (2013.01)

(58) Field of Classification Search
CPC ..... G01R 33/0023; G01R 33/00; G01R 33/07
See application file for complete search history.

(56) References Cited

U.S. PATENT DOCUMENTS 5,101,669 A 4/1992 Holm-Kennedy et al.
6,100,686 A 8/2000 Van Delden et al.
(Continued)

FOREIGN PATENT DOCUMENTS

CN 103630855 3/2014
CN 103645449 3/2014
(Continued)

OTHER PUBLICATIONS

"Office Action of Taiwan Counterpart Application," dated Apr. 10, 2018, p. 1-p. 8.

Primary Examiner — Giovanni Astacio-Oquendo
Assistant Examiner — Alvaro E Fortich
(74) Attorney, Agent, or Firm — JCIPRNET

(57) ABSTRACT

A magnetic field sensing apparatus including a plurality of first magnetoresistance units, a plurality of second magnetoresistance units, and a magnetic field sensing device is provided. Magnetic field sensing axes of the first and second magnetoresistance units are parallel to a first direction and a second direction respectively, and the first and second magnetoresistance units are disposed beside the magnetic field sensing device, which is configured to measure a magnetic field component in a third direction. The first and second magnetoresistance units are electrically connected to form at least one kind of Wheatstone full bridge in two different time periods to respectively measure magnetic field components in fourth and fifth directions and to cause this kind of Wheatstone full bridge to output two signals respectively corresponding to the magnetic field components in the fourth and fifth directions. The first direction to the fifth direction are different from each other.

16 Claims, 9 Drawing Sheets

(56) References Cited

U.S. PATENT DOCUMENTS

| | | | |
|---|---|---|---|
| 9,322,887 B1 | 4/2016 | Eagen et al. | |
| 2013/0082697 A1 | 4/2013 | Fu et al. | |
| 2015/0108971 A1* | 4/2015 | Granig | G01R 33/091 324/252 |
| 2015/0198677 A1* | 7/2015 | Romero | G01R 33/0017 324/207.2 |
| 2015/0358027 A1* | 12/2015 | Tanizawa | G01D 3/0365 341/118 |
| 2017/0108559 A1 | 4/2017 | Yuan et al. | |

FOREIGN PATENT DOCUMENTS

| | | |
|---|---|---|
| TW | 201337301 | 9/2013 |
| TW | 201430365 | 8/2014 |
| TW | 201508301 | 3/2015 |
| TW | I497097 | 8/2015 |
| TW | I518349 | 1/2016 |

* cited by examiner

MAGNETIC FIELD SENSING APPARATUS

CROSS-REFERENCE TO RELATED APPLICATION

This application claims the priority benefits of U.S. provisional application Ser. No. 62/419,957, filed on Nov. 9, 2016, and Taiwan application serial no. 106126810, filed on Aug. 9, 2017. The entirety of each of the above-mentioned patent applications is hereby incorporated by reference herein and made a part of this specification.

BACKGROUND OF THE INVENTION

Field of the Invention

The invention relates to a magnetic field sensing apparatus, and in particular, a magnetic field sensing apparatus capable of sensing a magnetic field in three dimensions.

Description of Related Art

As portable electronic devices become prevalent, electronic compass technology capable of sensing a geomagnetic direction has come to attention. When an electronic compass is applied to small-sized portable electronic devices (e.g., a smartphone), it is desired that the electronic compass is capable of three-axial sensing in addition to meeting the small-size requirement, since the mobile phone may be tilted when held by a user, and various holding angles are possible. Moreover, the electronic compass is also applicable to drones (e.g., a remotely controlled aircraft, a remotely controlled helicopter, etc.), and in that case, it is desired that the electronic compass is capable of three-axial sensing.

In the prior art, sensing of a magnetic field is generally performed by using anisotropic magnetoresistors (AMR resistor) under the framework of Wheatstone bridge. However, the conventional magnetic field sensing apparatus generally requires a larger layout area, which increases the manufacturing costs.

SUMMARY OF THE INVENTION

The embodiments of the invention provide a magnetic field sensing apparatus including a plurality of first magnetoresistance units, a plurality of second magnetoresistance units, and a magnetic field sensing device. A magnetic field sensing axis of the first magnetoresistance units is parallel to a first direction, and a magnetic field sensing axis of the second magnetoresistance units is parallel to a second direction. The magnetic field sensing device is configured to measure a magnetic field component in a third direction, wherein the first magnetoresistance units and the second magnetoresistance units are disposed beside the magnetic field sensing device. The first magnetoresistance units and second magnetoresistance units are electrically connected in two different time periods so as to form at least one kind of Wheatstone full bridge to respectively measure magnetic field components in a fourth direction and a fifth direction and to cause the at least one kind of Wheatstone full bridge to output two signals respectively corresponding to the magnetic field components in the fourth direction and the fifth direction. The first direction, the second direction, the third direction, the fourth direction, and the fifth direction are different from each other, the fourth direction is a sum vector direction of the first direction and the second direction, and the fifth direction is a difference vector direction of the first direction and the second direction.

In an embodiment of the invention, in any one of the two different time periods, the signal outputted by the at least one kind of Wheatstone full bridge is a differential signal corresponding to the magnetic field component in one direction of the fourth direction and the fifth direction. At this time, a differential signal generated by the at least one kind of Wheatstone full bridge corresponding to the magnetic field component in the other direction of the fourth direction and the fifth direction is 0.

In an embodiment of the invention, the first magnetoresistance units and the second magnetoresistance units are respectively disposed by two adjacent sides of the magnetic field sensing device.

In an embodiment of the invention, the magnetic field sensing apparatus further includes a plurality of magnetization direction setting devices respectively disposed beside the first magnetoresistance units and the second magnetoresistance units to respectively set magnetization directions of the first magnetoresistance units and the second magnetoresistance units.

In an embodiment of the invention, the magnetic field sensing apparatus further includes a substrate, wherein the magnetic field sensing device, the first magnetoresistance units, the second magnetoresistance units, and the magnetization direction setting devices are disposed on a surface of the substrate, and an area covered by the first magnetoresistance units, the second magnetoresistance units, and the magnetization direction setting devices on the surface and an area covered by the magnetic field sensing device on the surface are separated from each other.

In an embodiment of the invention, the at least one kind of Wheatstone full bridge is one kind of Wheatstone full bridge with a fixed connection, the magnetization direction setting devices respectively set the magnetization directions of the first magnetoresistance units and the second magnetoresistance units into two different combinations in the two different time periods to cause the one kind of Wheatstone full bridge to respectively measure the magnetic field components in the fourth direction and the fifth direction in the two different time periods and respectively output the two signals corresponding to the magnetic field components in the fourth direction and the fifth direction.

In an embodiment of the invention, each of the first magnetoresistance units includes a plurality of first magnetoresistors, and one part and the other part among the first magnetoresistors have opposite magnetization directions. Each of the second magnetoresistance units includes a plurality of second magnetoresistors, and one part and the other part among the second magnetoresistors have opposite magnetization directions.

In an embodiment of the invention, the magnetization directions of the one part and the other part among the first magnetoresistors are set to face away from each other, and the magnetization directions of the one part and the other part among the second magnetoresistors are set to point to each other.

In an embodiment of the invention, the magnetization directions of the one part and the other part among the first magnetoresistors are set to point to each other, and the magnetization directions of the one part and the other part among the second magnetoresistors are set to point to each other.

In an embodiment of the invention, the first magnetoresistors and the second magnetoresistors are anisotropic magnetoresistors having an extension direction, and surfaces of the first magnetoresistors and the second magnetoresistors each include a plurality of electrical shorting bars extending at a tilting angle with respect to the extension direction, wherein tilting directions of the electrical shorting bars on the surfaces of part of the magnetoresistors among the first magnetoresistors and the second magnetoresistors that have the same magnetization directions are opposite to each other.

In an embodiment of the invention, the magnetic field sensing apparatus further includes a switching circuit electrically connected to the first magnetoresistance units and the second magnetoresistance units, wherein the at least one kind of Wheatstone full bridge is two kinds of Wheatstone full bridge, and the switching circuit respectively electrically connects the first magnetoresistance units and the second magnetoresistance units in the two different time periods to form the two kinds of Wheatstone full bridge. The two kinds of Wheatstone full bridge respectively measure the magnetic field components in the fourth direction and the fifth direction and respectively output the two signals corresponding to the magnetic field components in the fourth direction and the fifth direction.

In an embodiment of the invention, each of the first magnetoresistance units and the second magnetoresistance units includes at least one anisotropic magnetoresistor.

In an embodiment of the invention, an extension direction of the anisotropic magnetoresistor belonging to the first magnetoresistance units is parallel to the second direction, and an extension direction of the anisotropic magnetoresistor belonging to the second magnetoresistance units is parallel to the first direction.

In an embodiment of the invention, the magnetic field sensing apparatus further includes a substrate, wherein the magnetic field sensing device, the first magnetoresistance units, and the second magnetoresistance units are disposed on a surface of the substrate, the first direction and the second direction are parallel to the surface, and the third direction is perpendicular to the surface.

In an embodiment of the invention, the substrate is a semiconductor substrate, a glass substrate, or a circuit substrate.

In an embodiment of the invention, the first direction, the second direction, and the third direction are perpendicular to each other, the fourth direction is perpendicular to the fifth direction, and the fourth direction has an included angle of 45 degrees with both the first direction and the second direction.

In light of the above, the magnetic field sensing apparatus of the embodiments of the invention adopts the plurality of first magnetoresistance units of which the magnetic field sensing axis is parallel to the first direction, the plurality of second magnetoresistance units of which the magnetic field sensing axis is parallel to the second direction, and the magnetic field sensing device. The magnetic field sensing device is configured to measure the magnetic field component in the third direction. The first magnetoresistance units and the second magnetoresistance units are disposed beside the magnetic field sensing device and are electrically connected to form the at least one kind of Wheatstone full bridge in the two different time periods so as to respectively measure the magnetic field components in the fourth direction and the fifth direction and to cause this kind of Wheatstone full bridge to output the two signals respectively corresponding to the magnetic field components in the fourth direction and the fifth direction, wherein the first direction, the second direction, the third direction, the fourth direction, and the fifth direction are different from each other, the fourth direction is a sum vector direction of the first direction and the second direction, and the fifth direction is a difference vector direction of the first direction and the second direction. Accordingly, the magnetic field sensing apparatus of the embodiments of the invention can have a simplified structure and simultaneously realize magnetic field measurement in three dimensions, and further have a smaller size and achieve the advantages of increasing flexibility in application and lowering the manufacturing costs.

To provide a further understanding of the aforementioned and other features and advantages of the disclosure, exemplary embodiments, together with the reference drawings, are described in detail below.

DESCRIPTION OF THE EMBODIMENTS

Figure 1A:
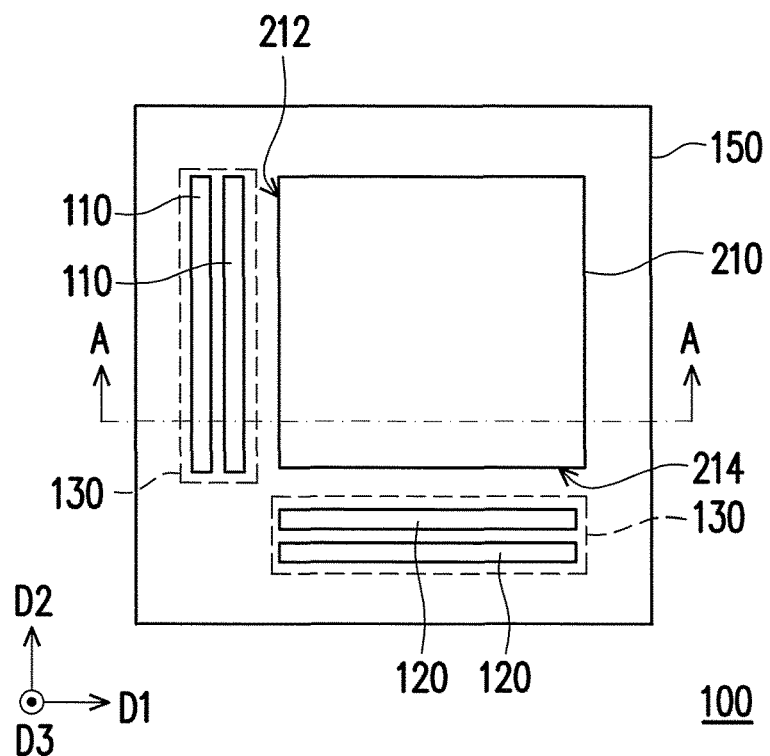
FIG. 1A is a top schematic diagram illustrating a magnetic field sensing apparatus according to an embodiment of the invention.
Figure 1B:
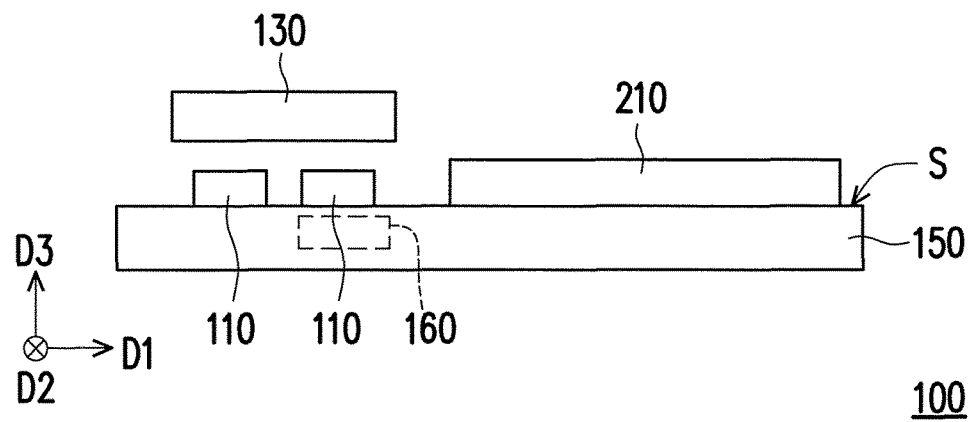
FIG. 1B is a cross-sectional schematic diagram illustrating the magnetic field sensing apparatus of FIG. 1A along line A-A.

FIG. 1A and FIG. 1B are schematic diagrams illustrating a magnetic field sensing apparatus according to an embodiment of the invention. FIG. 1A is a top schematic diagram illustrating a magnetic field sensing apparatus according to an embodiment of the invention, and FIG. 1B is a cross-sectional schematic diagram illustrating the magnetic field sensing apparatus of FIG. 1A along line A-A. Referring to FIG. 1A and FIG. 1B, a magnetic field sensing apparatus 100 of the present embodiment includes a plurality of first magnetoresistance units 110, a plurality of second magnetoresistance units 120, a plurality of magnetization direction setting devices 130, and a magnetic field sensing device 210.

In the present embodiment, the first magnetoresistance units 110, the second magnetoresistance units 120, the magnetization direction setting devices 130, and the magnetic field sensing device 210 are disposed on a surface S of a substrate 150, wherein the first magnetoresistance units 110 have a magnetic field sensing axis parallel to a first direction D1 and sense a magnetic field component in the first direction D1, and the second magnetoresistance units 120 have a magnetic field sensing axis parallel to a second direction D2 and sense a magnetic field component in the second direction D2. The first magnetoresistance units 110 and the second magnetoresistance units 120 are respectively disposed beside the magnetic field sensing device 210. In the example of FIG. 1A, the first magnetoresistance units 110 and the second magnetoresistance units 120 are respectively disposed by two adjacent sides 212, 214 of the magnetic field sensing device 210.

The magnetization direction setting devices 130 are respectively disposed beside the first magnetoresistance units 110 and the second magnetoresistance units 120 to respectively set magnetization directions of the first magnetoresistance units 110 and the second magnetoresistance units 120. The magnetization direction setting devices 130 may be selected to be disposed beside, above, or below the first magnetoresistance units 110 or the second magnetoresistance units 120 or disposed at the combination of the foregoing positions, which is not limited in the invention.

In other embodiments, the magnetization direction setting devices 130 may also be selected not to be disposed on the surface S of the substrate 150 but in the substrate 150. People of ordinary skill in the art may make appropriate variations according to the actual needs and the design, which is not limited in the invention. The substrate 150 is, for example, a semiconductor substrate (e.g., a silicon substrate), a glass substrate, or a circuit substrate, wherein the circuit substrate is, for example, a silicon substrate disposed with conductive lines and covered with an insulating layer on a surface thereof, which is not limited in the invention. Persons of ordinary skill in the art may make appropriate selections according to the prior art.

The magnetic field sensing devices 210 are configured to measure a magnetic field component in a third direction D3, and the third direction D3 is, for example, a direction perpendicular to the surface S. In the present embodiment, the first direction D1 and the second direction D2 are directions parallel to the surface S, and the first direction D1, the second direction D2, and the third direction D3 are perpendicular to each other, as a Cartesian coordinate system in FIG. 1A and FIG. 1B shows.

In the present embodiment, the magnetic field sensing device 210 is formed of, for example, magnetic field sensing devices having similar functions such as an anisotropic magnetoresistor (AMR resistor), a giant magnetoresistance (GMR) multi-layer film structure (or a tunneling magnetoresistance (TMR) multi-layer film structure), or a Hall element, or a combination of the above, which is not limited in the invention. Moreover, a shape and a size of the magnetic field sensing device 210 shown in the drawings are merely illustrative and are not limited in the invention.

Figure 2A:
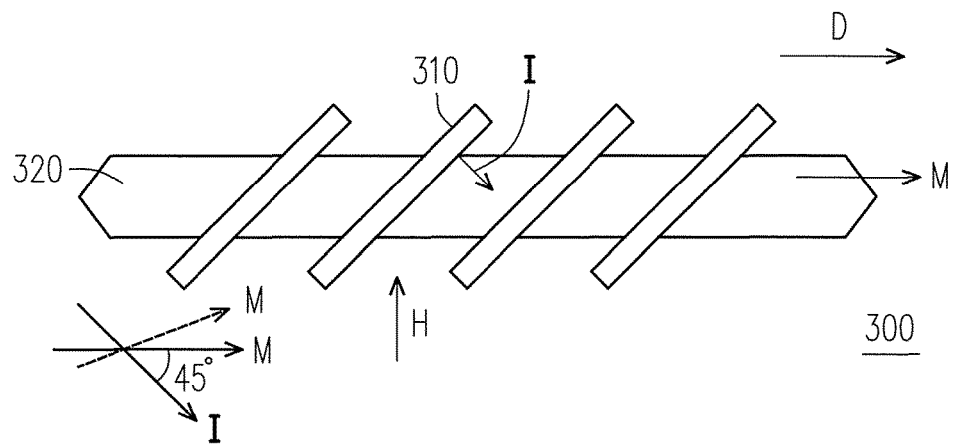
FIG. 2A and FIG. 2B illustrate an operation principle of the anisotropic magnetoresistor in FIG. 1A.
Figure 2B:
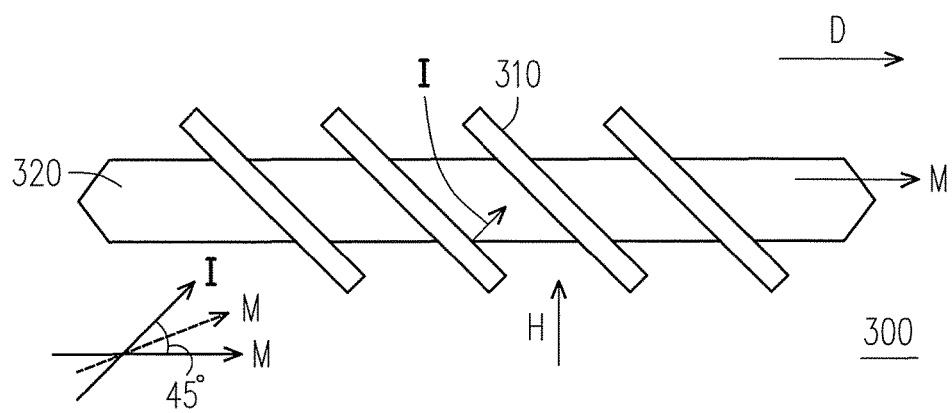

In addition, in the present embodiment, the first magnetoresistance units 110 and the second magnetoresistance units 120 respectively include at least one anisotropic magnetoresistor. FIG. 2A and FIG. 2B illustrate an operation principle of the anisotropic magnetoresistor in FIG. 1A. Referring to FIG. 2A first, an anisotropic magnetoresistor 300 has a barber-pole shaped structure; that is, a surface thereof has a plurality of electrical shorting bars 310 extending and inclining at a tilting angle of 45 degrees relative to an extension direction D of the anisotropic magnetoresistor 300. The electrical shorting bars 310 are disposed at an interval and parallel to each other on a ferromagnetic film 320, and the ferromagnetic film 320 is a main body of the anisotropic magnetoresistor 300 and has an extension direction that is the extension direction D of the anisotropic magnetoresistor 300. Moreover, two opposite ends of the ferromagnetic film 320 may be made into a pointed shape.

Before the anisotropic magnetoresistor 300 starts to measure an external magnetic field H, a magnetization direction of the anisotropic magnetoresistor 300 is set by the magnetization direction setting device 130, wherein the magnetization direction setting device 130 is, for example, a coil, a conductive wire, a metal sheet, or a conductor that generates a magnetic field through being applied an electric current. In FIG. 2A, the magnetization direction setting device 130 generates a magnetic field along the extension direction D through passage of electric current, such that the anisotropic magnetoresistor 300 has a magnetization direction M.

Then, the magnetization direction setting device 130 is not supplied with electric current so as to allow the anisotropic magnetoresistor 300 to start measuring the external magnetic field H. When there is no the external magnetic field H, the magnetization direction M of the anisotropic magnetoresistor 300 remains in the extension direction D. At this time, an electric current I is applied, such that the electric current I flows from a left end to a right end of the anisotropic magnetoresistor 300, and a flowing direction of the electric current I near the electrical shorting bars 310 is perpendicular to the extension direction of the electrical shorting bars 310. This causes the flowing direction of the electric current I near the electrical shorting bars 310 to have an included angle of 45 degrees with the magnetization direction M, and a resistance of the anisotropic magnetoresistor 300 is R.

When there is an external magnetic field H facing a direction perpendicular to the extension direction D, the magnetization direction M of the anisotropic magnetoresistor 300 is deflected towards a direction of the external magnetic field H, which causes the included angle between the magnetization direction and the flowing direction of the electric current I nearby the electrical shorting bars 310 to be greater than 45 degrees. At this time, the resistance of the anisotropic magnetoresistor 300 undergoes a change of −ΔR, i.e., becoming R−ΔR. In other words, the resistance is decreased, wherein ΔR is greater than 0.

However, as shown in FIG. 2B, when the extension direction of the electrical shorting bars 310 of FIG. 2B is set to be a direction having an included angle of 90 degrees with the extension direction of the electrical shorting bars 310 of FIG. 2A (at this time, the extension direction of the electrical shorting bars 310 of FIG. 2B still has an included angle of 45 degrees with the extension direction D of the anisotropic magnetoresistor 300) and when there is an external magnetic field H, the external magnetic field H still causes the magnetization direction M to deflect towards the direction of the external magnetic field H. At this time, the included angle between the magnetization direction M and the flowing direction of the electric current I near the electrical shorting bars 310 is smaller than 45 degrees, such that the resistance of the anisotropic magnetoresistor 300 becomes R+ΔR. In other words, the resistance of the anisotropic magnetoresistor 300 is increased.

Moreover, when the magnetization direction M of the anisotropic magnetoresistor 300 is set by the magnetization direction setting device 130 to be a reverse direction of that shown in FIG. 2A, the resistance of the anisotropic magnetoresistor 300 of FIG. 2A later becomes R+ΔR under the external magnetic field H. Furthermore, when the magnetization direction M of the anisotropic magnetoresistor 300 is set by the magnetization direction setting device 130 to be a reverse direction of that shown in FIG. 2B, the resistance of the anisotropic magnetoresistor 300 of FIG. 2B later becomes R−ΔR under the external magnetic field H.

In summary of the above, it is known that when a configuration direction of the electrical shorting bars 310 is changed, the change in the resistance R of the anisotropic magnetoresistor 300 corresponding to the external magnetic field H shifts from +ΔR to −ΔR or from −ΔR to +ΔR. Moreover, when the magnetization direction M set by the magnetization direction setting device 130 is reversed, the change in the resistance R of the anisotropic magnetoresistor 300 corresponding to the external magnetic field H shifts from +ΔR to −ΔR or from −ΔR to +ΔR. When the direction of the external magnetic field H is reversed, the change in the resistance R of the anisotropic magnetoresistor 300 corresponding to the external magnetic field H shifts from +ΔR to −ΔR or from −ΔR to +ΔR. However, when the flowing direction of the electric current I passing the anisotropic magnetoresistor 300 is reversed, the change in the resistance R of the anisotropic magnetoresistor 300 corresponding to the external magnetic field H retains the original plus or minus sign. In other words, if the change is originally +ΔR, it remains +ΔR after the flowing direction of the electric current is changed; if the change is originally −ΔR, it remains −ΔR after the flowing direction of the electric current is changed.

According to the principle above, the variation tendency of the resistance R of the anisotropic magnetoresistor 300, i.e., an increase or decrease in the resistance R (e.g., an amount of change is +ΔR or −ΔR), at the time when the anisotropic magnetoresistor 300 is subject to a component of the external magnetic field H, can be determined through designing the extension direction of the electrical shorting bars 310 or the magnetization direction M set by the magnetization direction setting device 130.

Referring to FIG. 3A to FIG. 4B, FIG. 3A and FIG. 4A are schematic diagrams respectively illustrating a magnetic field sensing apparatus at different time periods according to an embodiment of the invention. In a magnetic field sensing apparatus 100' of the present embodiment, the magnetoresistance units (including the first magnetoresistance units 110 and the second magnetoresistance units 120) are electrically connected in two different time periods to form at least one kind of Wheatstone full bridge (in the present embodiment, for example, a Wheatstone full bridge shown in FIG. 3A to FIG. 3C and a Wheatstone full bridge shown in FIG. 4A to FIG. 4C) to respectively measure magnetic field components in two different directions (i.e., a fourth direction D4 and a fifth direction D5) and cause the at least one kind of Wheatstone full bridge (e.g., the foregoing two kinds of Wheatstone full bridge) to output two signals respectively corresponding to the magnetic field components in the two different directions (e.g., the fourth direction D4 and the fifth direction D5).

In the present embodiment, the first direction D1, the second direction D2, the third direction D3, the fourth direction D4, and the fifth direction D5 are different from each other. The first direction D1, the second direction D2, and the third direction D3 are perpendicular to each other. The fourth direction D4 is a sum vector direction of the first direction D1 and the second direction D2. The fifth direction D5 is a difference vector direction of the first direction D1 and the second direction D2. Specifically, the first direction D1 and the second direction D2 are parallel to the surface S. The third direction D3 is perpendicular to the surface S. The fourth direction D4 and the fifth direction D5 are also parallel to the surface S. Moreover, the fourth direction D4 is perpendicular to the fifth direction D5. The fourth direction D4 has an included angle of 45 degrees with both the first direction D1 and the second direction D2. The fifth direction D5 has an included angle of 45 degrees with the second direction D2 and has an included angle of 45 degrees with a reverse direction of the first direction D1. In other embodiments, the three different directions D1, D2, D3 are not necessarily perpendicular to each other, and there may be at least two directions of them that are not perpendicular to each other.

Specifically, in the present embodiment, each of the first magnetoresistance units 110 and the second magnetoresistance units 120 includes at least one anisotropic magnetoresistor. The first magnetoresistance units 110 include a plurality of first magnetoresistors 112, 114, 116, 118 having a resistance R. The second magnetoresistance units 120 include a plurality of second magnetoresistors 122, 124, 126, 128 having the resistance R. The first magnetoresistors 112, 114, 116, 118 and the second magnetoresistors 122, 124, 126, 128 are, for example, the anisotropic magnetoresistor 300 having the extension direction D as shown in FIG. 2A and FIG. 2B, or a combination of a plurality of the anisotropic magnetoresistors 300, wherein the surface of the anisotropic magnetoresistors 300 each includes a plurality of the electrical shorting bars 310 extending at a tilting angle with respect to the extension direction D.

The extension direction D of the anisotropic magnetoresistors 300 belonging to the first magnetoresistance units 110 may be parallel to the second direction D2, or may be parallel to a side surface 212 of the magnetic field sensing device 210 and is parallel to the surface S. The extension direction D of the anisotropic magnetoresistors 300 belonging to the second magnetoresistance units 120 may be parallel to the first direction D1, or may be parallel to a side surface 214 of the magnetic field sensing device 210 and is also parallel to the surface S.

The first magnetoresistors 112, 114, 116, 118 and the second magnetoresistors 122, 124, 126, 128 may be connected to each other by conductive wires at tips of the anisotropic magnetoresistors 300 to generate electrical connection.

A magnetization direction setting device 132 covers the first magnetoresistors 112, 114 and a magnetization direction setting device 134 covers the first magnetoresistors 116, 118 to respectively set magnetization directions of the first magnetoresistors 112, 114 and the first magnetoresistors 116, 118. A magnetization direction setting device 136 covers the second magnetoresistors 122, 124 to set a magnetization direction of the second magnetoresistors 122, 124, and a magnetization direction setting device 138 covers the second magnetoresistors 126, 128 to set a magnetization direction of the second magnetoresistors 126, 128. Specifically, tilting directions of the electrical shorting bars 310 on the surface of the part of the magnetoresistors among the first magnetoresistors 112, 114, 116, 118 and the second magnetoresistors 122, 124, 126, 128 that are set by the magnetization direction setting devices 130 to have the same magnetization directions are opposite to each other.

It shall be noted that an area covered by the first magnetoresistance units 110, the second magnetoresistance units 120, and the magnetization direction setting devices 130 on the surface S and an area covered by the magnetic field sensing device 210 on surface S are separated from each other. In other words, the area covered by the magnetic field sensing device 210 on the surface S does not overlap with the area covered by the first magnetoresistance units 110, the second magnetoresistance units 120, and the magnetization direction setting devices 130 on the surface S.

In the present embodiment, in one of the two different time periods (e.g., in a first time period or a second time period), the at least one kind of Wheatstone full bridge has a fixed connection of Wheatstone full bridge. The magnetization direction setting devices 130 respectively set the magnetization directions of the first magnetoresistance units 110 and the second magnetoresistance units 120 in the two different time periods to be two different combinations (e.g., the Wheatstone full bridge shown in FIG. 3A to FIG. 3C and the Wheatstone full bridge shown in FIG. 4A to FIG. 4C) to cause this kind of Wheatstone full bridge to respectively measure the magnetic field components in the fourth direction D4 and the fifth direction D5 in the two different time periods and respectively output the two signals corresponding to the magnetic field components in the fourth direction D4 and the fifth direction D5. The embodiment is described in detail below.

Figure 3A:
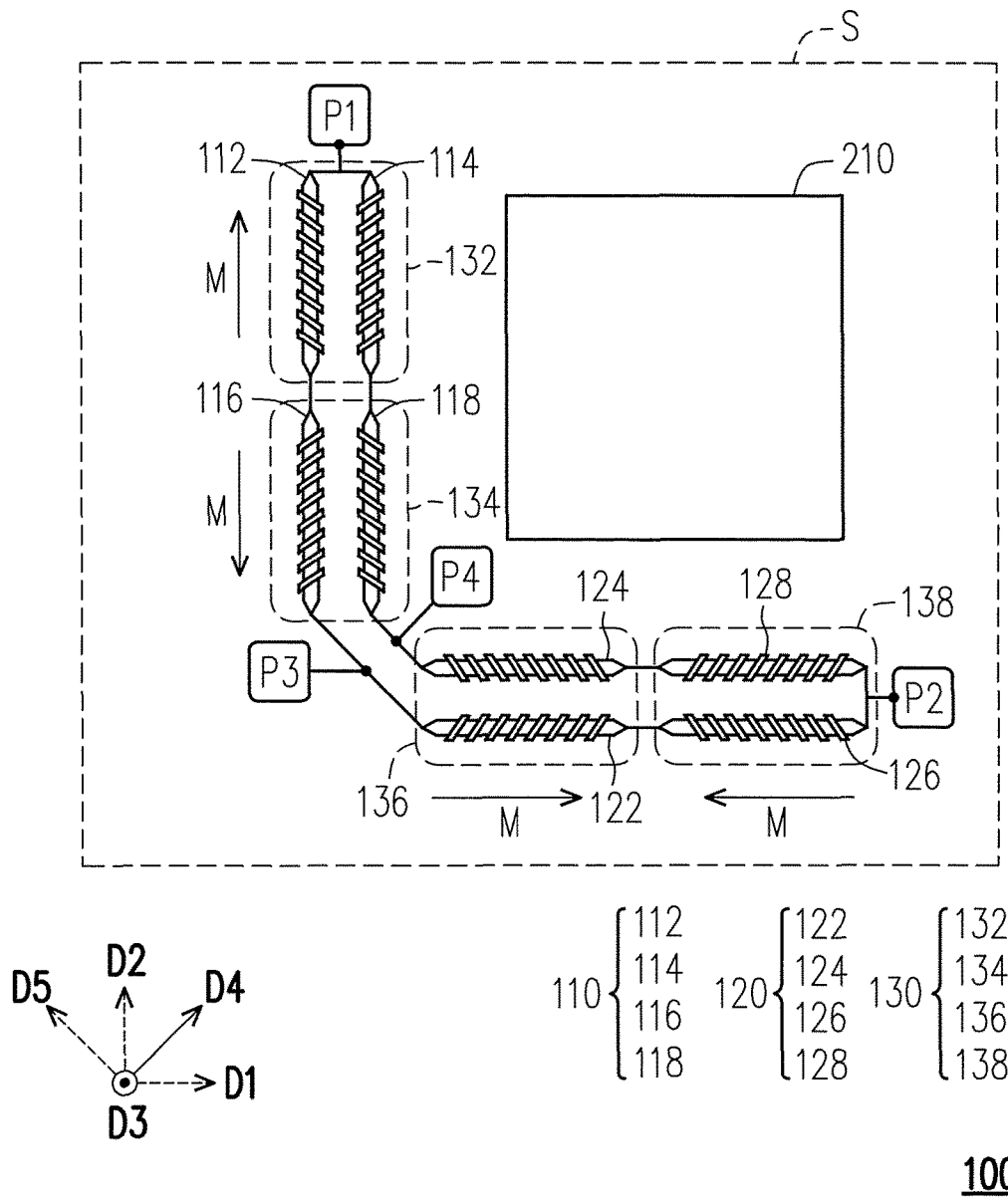
FIG. 3A is a schematic diagram illustrating configuration of electrical shorting bars and the setting of magnetization directions of magnetoresistors applicable to one kind of Wheatstone full bridge in a first time period according to an embodiment of the invention.

In the first time period of the two different time periods, referring to FIG. 3A, FIG. 3A is a schematic diagram illustrating configuration of electrical shorting bars and the setting of magnetization directions of magnetoresistors applicable to one kind of Wheatstone full bridge in a first time period according to an embodiment of the invention. The first magnetoresistors 112, 114 are set by the magnetization direction setting device 132 to have a magnetization direction pointing to a forward direction of the second direction D2. The first magnetoresistors 116, 118 are set by the magnetization direction setting device 134 to have a magnetization direction pointing to a reverse direction of the second direction D2. In other words, the magnetization directions of a part (i.e., the first magnetoresistors 112, 114) and the other part (i.e., the first magnetoresistors 116, 118) among the first magnetoresistors are set to be face away from each other. The second magnetoresistors 122, 124 are set by the magnetization direction setting device 136 to have a magnetization direction pointing to a forward direction of the first direction D1. The second magnetoresistors 126, 128 are set by the magnetization direction setting device 138 to have a magnetization direction pointing to a reverse direction of the first direction D1. In other words, the magnetization directions of a part (i.e., the second magnetoresistors 122, 124) and the other part (i.e., the second magnetoresistors 126, 128) among the second magnetoresistors are set to point to each other.

The tilting directions of the electrical shorting bars 310 on the surface of the first magnetoresistor 112 and the first magnetoresistor 114, which have the same magnetization direction (both covered by the magnetization direction setting device 132) but belong to different first magnetoresistance units 110, are opposite to each other. The tilting directions of the electrical shorting bars 310 on the surface of the first magnetoresistor 116 and the first magnetoresistor 118, which have the same magnetization direction (both covered by the magnetization direction setting device 134) but belong to different first magnetoresistance units 110, are also opposite to each other. The tilting directions of the electrical shorting bars 310 on the surface of the second magnetoresistor 122 and the second magnetoresistor 124, which have the same magnetization direction (both covered by the magnetization direction setting device 136) but belong to different second magnetoresistance units 120, are opposite to each other. The tilting directions of the electrical shorting bars 310 on the surface of the second magnetoresistor 126 and the second magnetoresistor 128, which have the same magnetization direction (both covered by the magnetization direction setting device 138) but belong to different second magnetoresistance units 120, are also opposite to each other.

It shall be noted that the first magnetoresistors 112, 116, which belong to the same first magnetoresistance unit 110, have different magnetization directions, and the tilting directions of the electrical shorting bars 310 on the surface are also different. The first magnetoresistors 114, 118, which belong to the same first magnetoresistance unit 110, have different magnetization directions, and the tilting directions of the electrical shorting bars 310 on the surface are also different. Similarly, the second magnetoresistors 122, 126, which belong to the same second magnetoresistance unit 120, have different magnetization directions, and the tilting directions of the electrical shorting bars 310 on the surface are also different. The second magnetoresistors 124, 128, which belong to the same second magnetoresistance unit 120, have different magnetization directions, and the tilting directions of the electrical shorting bars 310 on the surface are also different. However, the part and the other part among the first magnetoresistors 112, 114, 116, 118 have opposite magnetization directions, and the part and the other part among the second magnetoresistors 122, 124, 126, 128 also have opposite magnetization directions.

When the external applied magnetic field is in the fourth direction D4, the first magnetoresistors 112, 116 sense the magnetic field component in the first direction D1 and respectively generate a change $+\Delta R$ in resistance. The first magnetoresistors 114, 118 sense the magnetic field component in the first direction D1 and respectively generate a change $-\Delta R$ in resistance. On the other hand, the second magnetoresistors 124, 128 sense the magnetic field component in the second direction D2 and respectively generate a change $+\Delta R$ in resistance, and the second magnetoresistors 122, 126 sense the magnetic field component in the second direction D2 and respectively generate a change $-\Delta R$ in resistance.

Figure 3B:
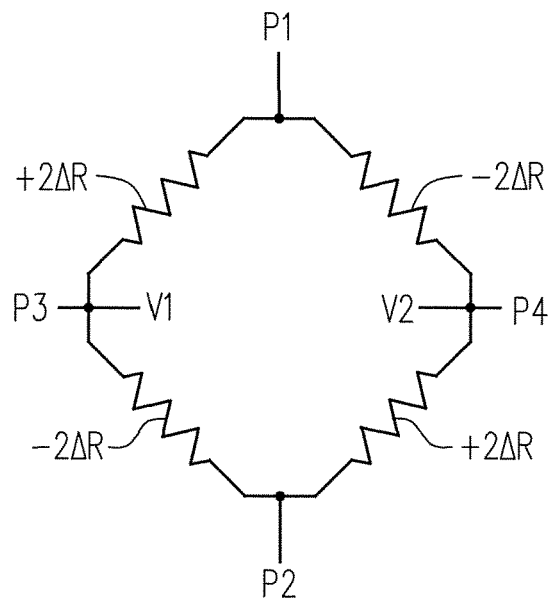
FIG. 3B is an equivalent circuit diagram of the magnetic field sensing apparatus of the embodiment of FIG. 3A in the period of measuring a magnetic field component in a fourth direction.

Referring to FIG. 3B, FIG. 3B is an equivalent circuit diagram of the magnetic field sensing apparatus of the embodiment of FIG. 3A in the time period of measuring the magnetic field component in the fourth direction. Due to the configurations as described in the paragraphs related to FIG. 3A (including the configuration of the electrical shorting bars 310 and the setting of initial magnetization directions of the first magnetoresistance units 110 and the second magnetoresistance units 120), changes $+2\Delta R$ and $-2\Delta R$ in resistance respectively exist between a junction point P1 and junction points P3, P4, and changes $-2\Delta R$ and $+2\Delta R$ in resistance respectively exist between a junction point P2 and the junction points P3, P4, wherein the junction points P1, P2, P3, P4 are, for example, electrodes. Accordingly, when a voltage difference is applied to the junction points P1 and P2 (for example, the junction point P1 receives a reference voltage VDD and the junction point P2 is coupled to ground, or the junction point P2 receives the reference voltage VDD and the junction point P1 is coupled to ground), a voltage difference between a voltage value V1 of the junction point P3 and a voltage value V2 of the junction point P4 may be used as an output signal. This output signal is a differential signal, and its magnitude corresponds to a magnitude of the magnetic field component in the fourth direction D4. Accordingly, by obtaining the magnitude of the output signal, the magnitude of the magnetic field component in the fourth direction D4 can be inferred.

In another embodiment, it may also be the case that the junction point P3 receives the reference voltage VDD and the junction point P4 is coupled to ground (or the other way around), and the signal is outputted according to a voltage difference between a voltage value of the junction point P1 and a voltage value of the junction point P2.

Figure 3C:
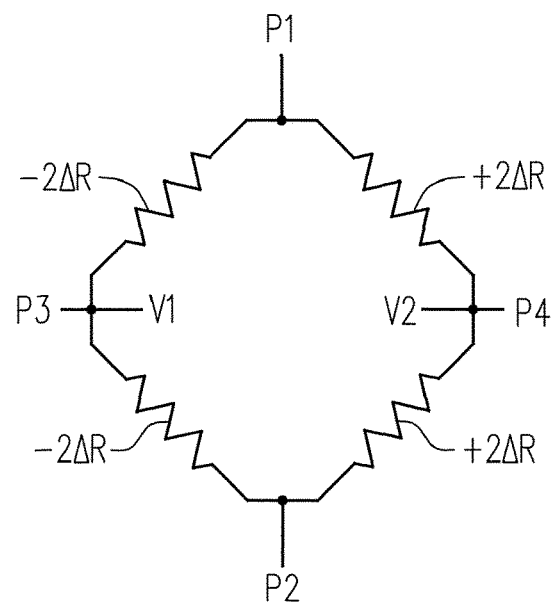
FIG. 3C is an equivalent circuit diagram of the magnetic field sensing apparatus of the embodiment of FIG. 3A in the period of measuring a magnetic field component in a fifth direction.

Referring to FIG. 3C, FIG. 3C is an equivalent circuit diagram of the magnetic field sensing apparatus of the embodiment of FIG. 3A in the time period of measuring the magnetic field component in the fifth direction. According to the configuration of the magnetic field sensing apparatus 100' shown in FIG. 3A, when the external applied magnetic field is in the fifth direction D5, the first magnetoresistors 112, 116 sense the magnetic field component in the reverse direction of the first direction D1 and respectively generate a change $-\Delta R$ in resistance. The first magnetoresistors 114, 118 sense the magnetic field component in the reverse direction of the first direction D1 and respectively generate a change $+\Delta R$ in resistance. On the other hand, the second magnetoresistors 124, 128 sense the magnetic field component in the second direction D2 and respectively generate a change $+\Delta R$ in resistance, and the second magnetoresistors 122, 126 sense the magnetic field component in the second direction D2 and respectively generate a change $-\Delta R$ in resistance. In other words, changes $-2\Delta R$ and $+2\Delta R$ in resistance respectively exist between the junction point P1 and the junction points P3, P4, and the changes in resistance between the junction point P2 and the junction points P3, P4 remain unchanged, i.e., the changes $-2\Delta R$ and $+2\Delta R$ in resistance still respectively exist. Therefore, the differential signal outputted between the junction points P3 and P4 corresponding to the magnetic field component in the fifth direction D5 is 0.

Figure 4A:
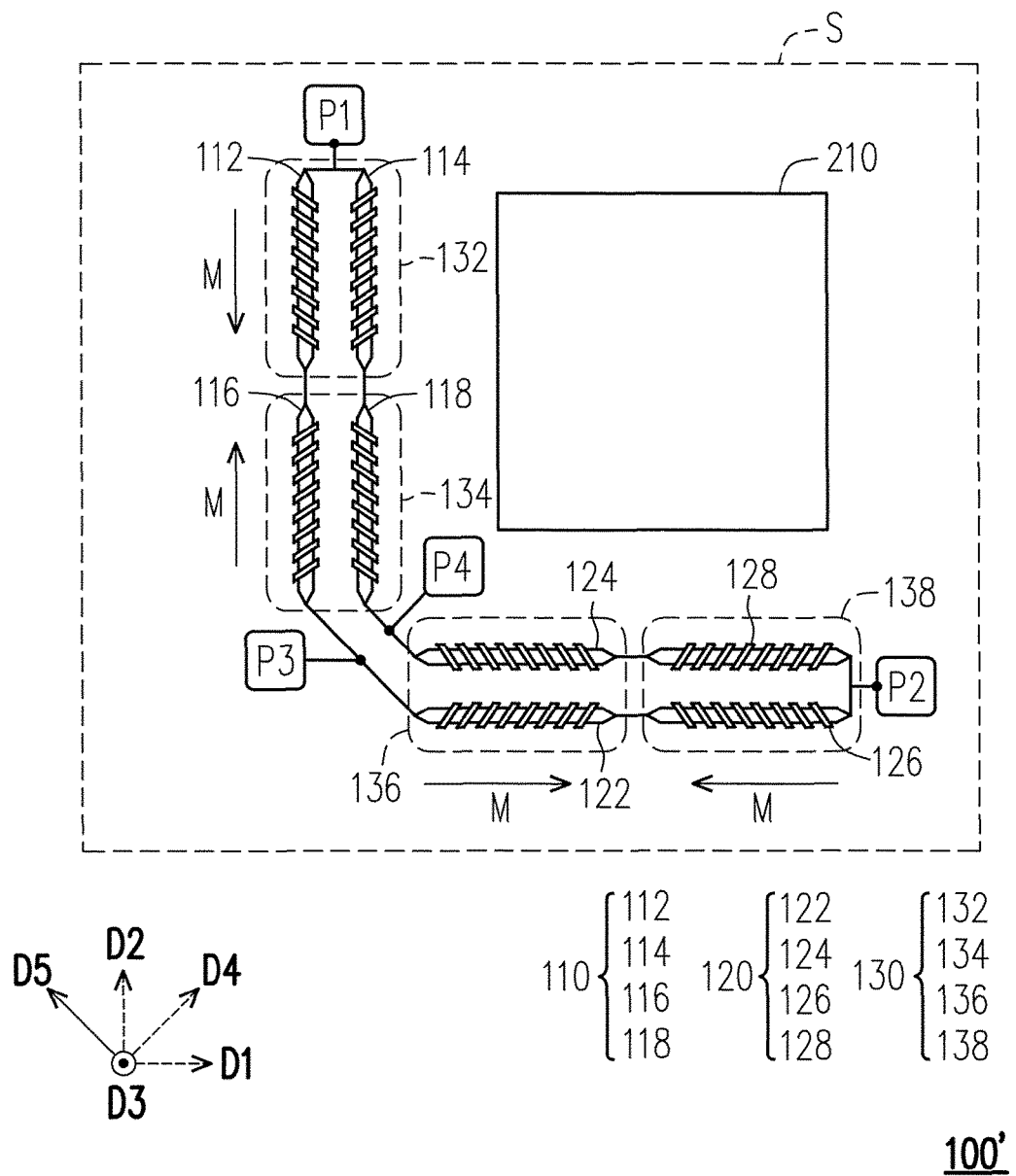
FIG. 4A is a schematic diagram illustrating configuration of electrical shorting bars and the setting of magnetization directions of magnetoresistors applicable to one kind of Wheatstone full bridge in a second time period according to an embodiment of the invention.

In the second time period of the two different time periods, referring to FIG. 4A, FIG. 4A is a schematic diagram illustrating configuration of electrical shorting bars and the setting of magnetization directions of magnetoresistors applicable to one kind of Wheatstone full bridge in the second time period according to an embodiment of the invention. Reference may be made to the description in paragraphs related to FIG. 3A. The configuration of the electrical shorting bars of the magnetic field sensing apparatus 100' remain unchanged, but the setting of the magnetization directions are changed. The first magnetoresistors 112, 114 are set by the magnetization direction setting device 132 to have a magnetization direction pointing to the reverse direction of the second direction D2. The first magnetoresistors 116, 118 are set by the magnetization direction setting device 134 to have a magnetization direction pointing to the second direction D2. In other words, the magnetization directions of a part (i.e., the first magnetoresistors 112, 114) and the other part (i.e., the first magnetoresistors 116, 118) among the first magnetoresistors are set to point to each other. The second magnetoresistors 122, 124 are set by the magnetization direction setting device 136 to have a magnetization direction pointing to the forward direction of the first direction D1. The second magnetoresistors 126, 128 are set by the magnetization direction setting device 138 to have a magnetization direction pointing to the reverse direction of the first direction D1. In other words, the magnetization directions of a part (i.e., the second magnetoresistors 122, 124) and the other part (i.e., the second magnetoresistors 126, 128) among the second magnetoresistors are set to point to each other. The tilting directions of the electrical shorting bars 310 on the surface of the part of the magnetoresistors among the first magnetoresistors 112, 114, 116, 118 and the second magnetoresistors 122, 124, 126, 128 that have the same magnetization directions are still opposite to each other.

Figure 4B:
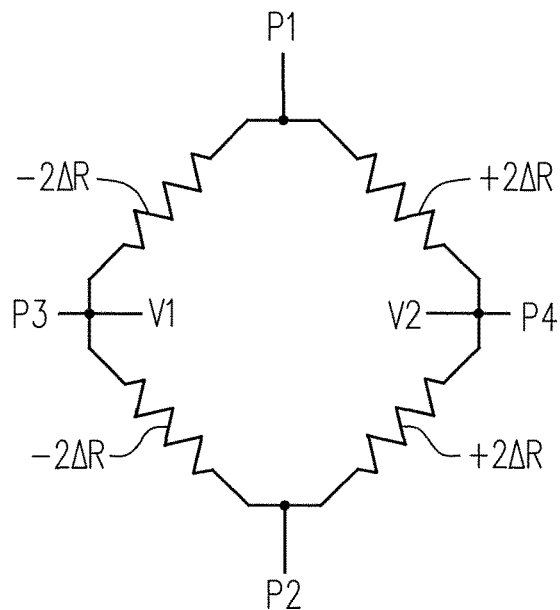
FIG. 4B is an equivalent circuit diagram of the magnetic field sensing apparatus of the embodiment of FIG. 4A in the time period of measuring the magnetic field component in the fourth direction.

Referring to FIG. 4B, FIG. 4B is an equivalent circuit diagram of the magnetic field sensing apparatus of the embodiment of FIG. 4A in the time period of measuring the magnetic field component in the fourth direction. Due to the configurations as described in the paragraphs related to FIG. 4A (including the configuration of the electrical shorting bars 310 and the setting of initial magnetization directions of the first magnetoresistance units 110 and the second magnetoresistance units 120), changes $-2\Delta R$ and $+2\Delta R$ in resistance respectively exist between the junction point P1 and the junction points P3, P4, and changes $-2\Delta R$ and $+2\Delta R$ in resistance respectively exist between the junction point P2 and the junction points P3, P4. Accordingly, when a voltage difference is applied to the junction points P1 and P2 (e.g., the junction point P1 receives a reference voltage VDD and the junction point P2 is coupled to ground), the differential signal outputted between the voltage value V1 of the junction point P3 and the voltage value V2 of the junction point P4 is 0.

Figure 4C:
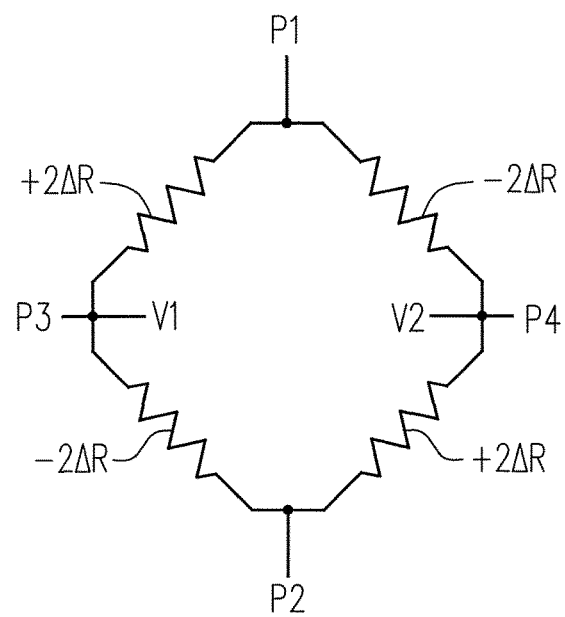
FIG. 4C is an equivalent circuit diagram of the magnetic field sensing apparatus of the embodiment of FIG. 4A in the time period of measuring the magnetic field component in the fifth direction.

Referring to FIG. 4C, FIG. 4C is an equivalent circuit diagram of the magnetic field sensing apparatus of the embodiment of FIG. 4A at the time of measuring the magnetic field component in the fifth direction. Due to the implementation as described in the paragraphs related to FIG. 3A to FIG. 4B (including the configuration of the electrical shorting bars 310, the setting of initial magnetization directions of the first magnetoresistance units 110 and the second magnetoresistance units 120, and the relevant changes in resistance), changes $+2\Delta R$ and $-2\Delta R$ in resistance respectively exist between the junction point P1 and the junction points P3, P4, and changes $-2\Delta R$ and $+2\Delta R$ in resistance respectively exist between the junction point P2 and the junction points P3, P4. Accordingly, when a voltage difference is applied to the junction points P1 and P2, the magnitude of the output signal between the voltage value V1 of the junction point P3 and the voltage value V2 of the junction point P4 corresponds to the magnitude of the magnetic field component in the fifth direction D5.

In the magnetic field sensing apparatus 100' of the present embodiment, in any one time period of the two different time periods (i.e., the first time period and the second time period), the signal outputted by the at least one kind of Wheatstone full bridge (e.g., the Wheatstone full bridge shown in FIG. 3A to FIG. 3C or the Wheatstone full bridge shown in FIG. 4A to FIG. 4C) is the differential signal corresponding to the magnetic field component in one direction of the fourth direction D4 and the fifth direction D5. At this time, the differential signal corresponding to the magnetic field component in the other direction of the fourth direction D4 and the fifth direction D5 generated by the at least one kind of Wheatstone full bridge is 0.

In the magnetic field sensing apparatus 100' of the present embodiment, by respectively changing the magnetization directions of the first magnetoresistance units 110 and the second magnetoresistance units 120 in the two different time periods, the first magnetoresistance units 110 and the second magnetoresistance units 120 are electrically connected to form the at least one kind of Wheatstone full bridge to respectively measure the magnetic field components in the fourth direction D4 and the fifth direction D5 and cause this kind of Wheatstone full bridge to output the two signals respectively corresponding to the magnetic field components in the fourth direction D4 and the fifth direction D5, and the magnetic field sensing device 210 is configured to measure the magnetic field component in the third direction. Accordingly, the magnetic field sensing apparatus 100' of the present embodiment can simultaneously realize magnetic field measurement in three dimensions and have a simplified structure, and further have a smaller size and achieve the advantages of increasing flexibility in application and lowering the manufacturing costs.

Figure 5A:
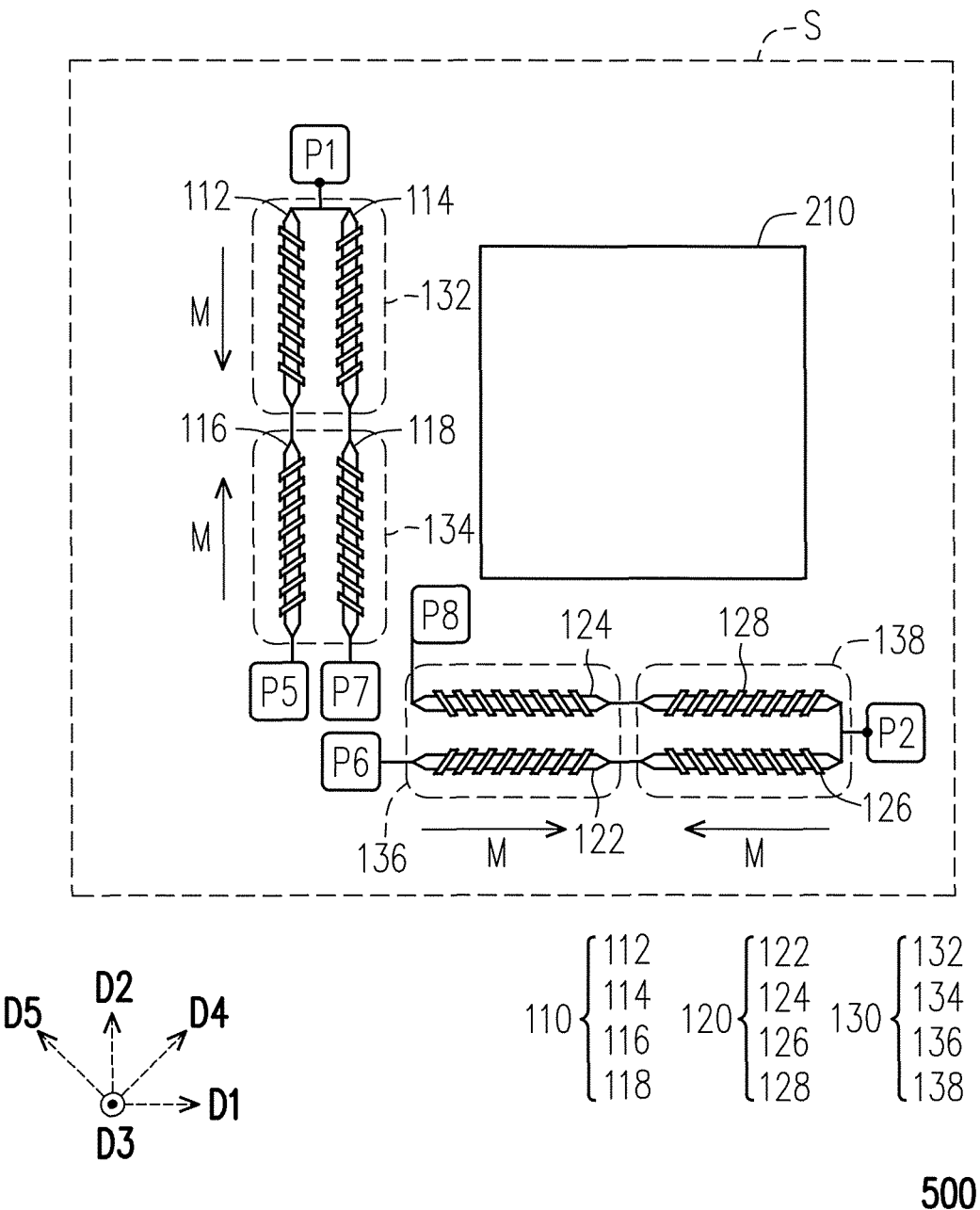
FIG. 5A is a schematic diagram illustrating configuration of electrical shorting bars and the setting of magnetization directions of magnetoresistors of a magnetic field sensing apparatus according to another embodiment of the invention.

Referring to FIG. 5A, FIG. 5A is a schematic diagram illustrating configuration of electrical shorting bars and the setting of magnetization directions of magnetoresistors of a magnetic field sensing apparatus according to another embodiment of the invention. The embodiment of FIG. 5A further includes a switching circuit 160 (see FIG. 1B). The switching circuit 160 is, for example, disposed in the substrate 150 and electrically connects the first magnetoresistance units 110 and the second magnetoresistance units 120. The first magnetoresistance units 110 and the second magnetoresistance units 120 respectively form a Wheatstone half bridge structure. By switching connections among junction points P5, P6, P7, P8, the first magnetoresistance units 110 and the second magnetoresistance units 120 are electrically connected respectively in two different time periods to form two kinds of Wheatstone full bridge. The two kinds of Wheatstone full bridge respectively measure the magnetic field components in the fourth direction D4 and the fifth direction D5 and respectively output two signals corresponding to the magnetic field components in the fourth direction D4 and the fifth direction D5, as shown in FIG. 5B to FIG. 5E. The junction points P5, P6, P7, and P8 are, for example, electrodes.

Figure 5B:
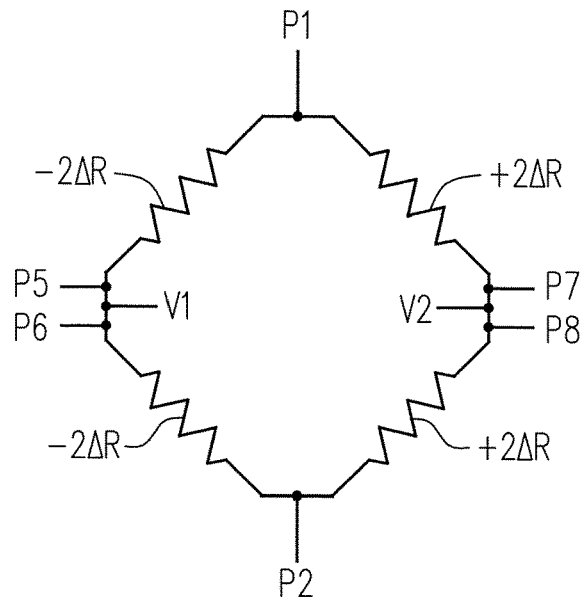
FIG. 5B and FIG. 5C are respectively equivalent circuit diagrams of the magnetic field sensing apparatus of the embodiment of FIG. 5A measuring the magnetic field components in the fourth direction and the fifth direction in the first time period.

In the first time period of the two different time periods, the switching circuit 160 connects the junction point P5 to the junction point P6 and connects the junction point P7 to the junction point P8. In this time period, the relevant implementation (including the configuration of the electrical shorting bars 310 and the setting of initial magnetization directions of the first magnetoresistance units 110 and the second magnetoresistance units 120) and the electrical connections of a magnetic field sensing apparatus 500 are similar to the embodiment of FIG. 4A. Referring to FIG. 5B, FIG. 5B is an equivalent circuit diagram of the magnetic field sensing apparatus of the embodiment of FIG. 5A measuring the magnetic field component in the fourth direction in the first time period. In this time period, the differential signal outputted corresponding to the fourth direction D4 is 0.

Figure 5C:
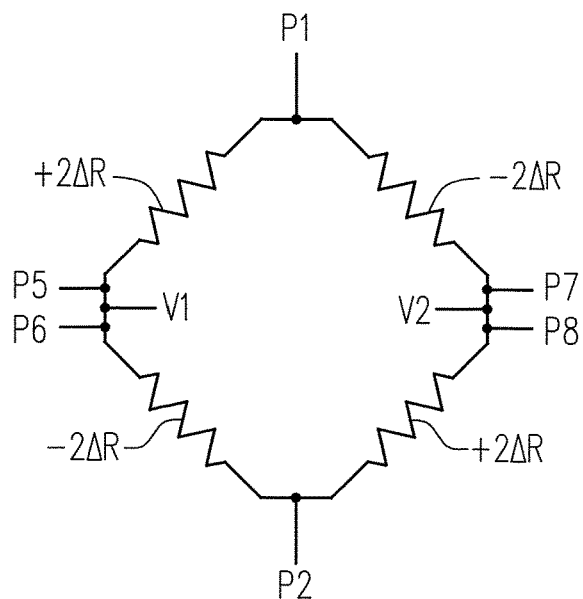

Referring to FIG. 5C, FIG. 5C is an equivalent circuit diagram of the magnetic field sensing apparatus of the embodiment of FIG. 5A measuring the magnetic field component in the fifth direction in the first time period. Sensing the magnetic field component in the fifth direction D5, the equivalent circuit of FIG. 5C outputs a corresponding differential signal between the voltage value V1 and the voltage value V2 to thereby measure the magnitude of the magnetic field component in the fifth direction D5. The specific embodiment has been sufficiently taught, suggested, and described in the foregoing embodiment of FIG. 4A to FIG. 4C and is thus not repeatedly described here.

Figure 5D:
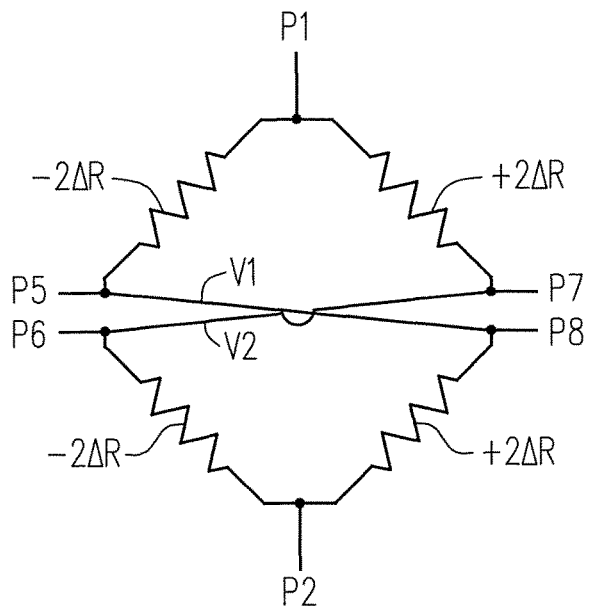
FIG. 5D and FIG. 5E are respectively equivalent circuit diagrams of the magnetic field sensing apparatus of the embodiment of FIG. 5A measuring the magnetic field components in the fourth direction and the fifth direction in the second time period.
Figure 5E:
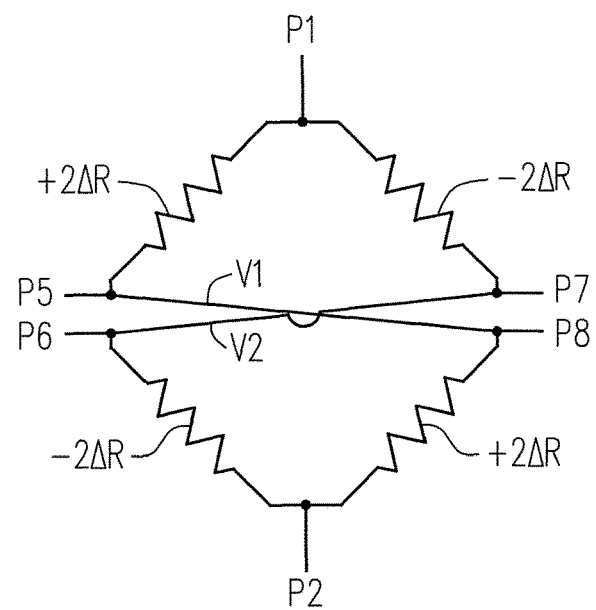

In the second time period of the two different time periods, the switching circuit 160 connects the junction point P5 to the junction point P8 and connects the junction point P7 to the junction point P6. The configuration of the electrical shorting bars 310 and the setting of initial magnetization directions of the first magnetoresistance units 110 and the second magnetoresistance units 120 are not changed, but the electrical connection is changed. Please refer to FIG. 5D and FIG. 5E for equivalent circuits of the magnetic field sensing apparatus 500 at this time. FIG. 5D is an equivalent circuit diagram of a magnetic field sensing apparatus according to another embodiment of the invention measuring the magnetic field component in the fourth direction in the second time period, wherein the equivalent circuit senses the magnetic field component in the fourth direction D4 and outputs a corresponding differential signal between the voltage value V1 and the voltage value V2 to measure the magnitude of the magnetic field component in the fourth direction D4 according to the magnitude of the differential signal. FIG. 5E is an equivalent circuit diagram of a magnetic field sensing apparatus according to another embodiment of the invention measuring the magnetic field component in the fifth direction in the second time period. In this time period, sensing the magnetic field component in the fifth direction D5, the differential signal outputted by the Wheatstone full bridge is 0. The specific embodiment has been sufficiently taught, suggested, and described in the foregoing embodiments of FIG. 1A to FIG. 5B and is thus not repeatedly described here.

Moreover, in the foregoing embodiment, in any one of the two different time periods, a number of Wheatstone full bridge formed by electrically connecting the first magnetoresistance units 110 and the second magnetoresistance units 120 is one.

Therefore, in the magnetic field sensing apparatus 500 of the present embodiment, the switching circuit 160 respectively electrically connects the first magnetoresistance units 110 and the second magnetoresistance units 120 in the two different time periods to form the at least one kind of Wheatstone full bridge to respectively measure the magnetic field components in the fourth direction D4 and the fifth direction D5 and cause this kind of Wheatstone full bridge to output two signals respectively corresponding to the magnetic field components in the fourth direction D4 and the fifth direction D5, and the magnetic field sensing device 210 is configured to measure of the magnetic field component in the third direction. Accordingly, the magnetic field sensing apparatus 500 can simultaneously realize magnetic field measurement in three dimensions and have a simplified structure, and further have a smaller size and achieve the advantages of increasing flexibility in application and lowering the manufacturing costs.

In summary of the above, the magnetic field sensing apparatus of the embodiments of the invention adopts the plurality of first magnetoresistance units of which the magnetic field sensing axis is parallel to the first direction, the plurality of second magnetoresistance units of which the magnetic field sensing axis is parallel to the second direction, and the magnetic field sensing device. The magnetic field sensing device is configured to measure the magnetic field component in the third direction. The first magnetoresistance units and the second magnetoresistance units are disposed beside the magnetic field sensing device and are electrically connected in the two different time periods to form the at least one kind of Wheatstone full bridge to respectively measure the magnetic field components in the fourth direction and the fifth direction and cause this kind of Wheatstone full bridge to output the two signals respectively corresponding to the magnetic field components in the fourth direction and the fifth direction, wherein the first direction, the second direction, the third direction, the fourth direction, and the fifth direction are different from each other, the fourth direction is a sum vector direction of the first direction and the second direction, and the fifth direction is a difference vector direction of the first direction and the second direction. Accordingly, the magnetic field sensing apparatus of the embodiments of the invention can have a simplified structure and simultaneously realize magnetic field measurement in three dimensions, and further have a smaller size and achieve the advantages of increasing flexibility in application and lowering the manufacturing costs.

Although the invention is disclosed as the embodiments above, the embodiments are not meant to limit the invention. Any person skilled in the art may make slight modifications and variations without departing from the spirit and scope of the invention. Therefore, the protection scope of the invention shall be defined by the claims attached below.

What is claimed is:

1. A magnetic field sensing apparatus comprising:
   a plurality of first magnetoresistance units, wherein a magnetic field sensing axis of the first magnetoresistance units is parallel to a first direction;
   a plurality of second magnetoresistance units, wherein a magnetic field sensing axis of the second magnetoresistance units is parallel to a second direction; and
   a magnetic field sensing device, configured to measure a magnetic field component in a third direction, wherein the first magnetoresistance units and the second magnetoresistance units are disposed beside the magnetic field sensing device,
   wherein the first magnetoresistance units and the second magnetoresistance units are electrically connected to form at least one kind of Wheatstone full bridge in two different time periods so as to respectively measure magnetic field components in a fourth direction and a fifth direction and to cause the at least one kind of Wheatstone full bridge to output two signals respectively corresponding to the magnetic field components in the fourth direction and the fifth direction, wherein the first direction, the second direction, the third direction, the fourth direction, and the fifth direction are different from each other, the fourth direction is a sum vector direction of the first direction and the second direction, and the fifth direction is a difference vector direction of the first direction and the second direction.

2. The magnetic field sensing apparatus according to claim 1, wherein in any one of the two different time periods, a signal outputted by the at least one kind of Wheatstone full bridge is a differential signal corresponding to the magnetic field component in one direction of the fourth direction and the fifth direction, and at this time, a differential signal generated by the at least one kind of Wheatstone full bridge and corresponding to the magnetic field component in another direction of the fourth direction and the fifth direction is 0.

3. The magnetic field sensing apparatus according to claim 1, wherein the first magnetoresistance units and the second magnetoresistance units are respectively disposed by two adjacent sides of the magnetic field sensing device.

4. The magnetic field sensing apparatus according to claim 1, further comprising a plurality of magnetization direction setting devices respectively disposed beside the first magnetoresistance units and the second magnetoresistance units to respectively set magnetization directions of the first magnetoresistance units and the second magnetoresistance units.

5. The magnetic field sensing apparatus according to claim 4, further comprising a substrate, wherein the magnetic field sensing device, the first magnetoresistance units, the second magnetoresistance units, and the magnetization direction setting devices are disposed on a surface of the substrate, and an area covered by the first magnetoresistance units, the second magnetoresistance units, and the magnetization direction setting devices on the surface and an area covered by the magnetic field sensing device on the surface are separated from each other.

6. The magnetic field sensing apparatus according to claim 4, wherein the at least one kind of Wheatstone full bridge is one kind of Wheatstone full bridge with a fixed connection, the magnetization direction setting devices respectively set the magnetization directions of the first magnetoresistance units and the second magnetoresistance units into two different combinations in the two different time periods to cause the one kind of Wheatstone full bridge to respectively measure the magnetic field components in the fourth direction and the fifth direction in the two different time periods and respectively output the two signals corresponding to the magnetic field components in the fourth direction and the fifth direction.

7. The magnetic field sensing apparatus according to claim 4, wherein each of the first magnetoresistance units comprises a plurality of first magnetoresistors, and one part and the other part among the first magnetoresistors have opposite magnetization directions, wherein each of the second magnetoresistance units comprises a plurality of second magnetoresistors, and one part and the other part among the second magnetoresistors have opposite magnetization directions.

8. The magnetic field sensing apparatus according to claim 7, wherein the magnetization directions of the one part and the other part among the first magnetoresistors are set to face away from each other, and the magnetization directions of the one part and the other part among the second magnetoresistors are set to point to each other.

9. The magnetic field sensing apparatus according to claim 7, wherein the magnetization directions of the one part and the other part among the first magnetoresistors are set to point to each other, and the magnetization directions of the one part and the other part among the second magnetoresistors are set to point to each other.

10. The magnetic field sensing apparatus according to claim 7, wherein the first magnetoresistors and the second magnetoresistors are anisotropic magnetoresistors having an extension direction, and surfaces of the first magnetoresistors and the second magnetoresistors each comprise a plurality of electrical shorting bars extending at a tilting angle with respect to an extension direction, wherein tilting directions of the electrical shorting bars on the surfaces of part of the magnetoresistors among the first magnetoresistors and the second magnetoresistors that have the same magnetization directions are opposite to each other.

11. The magnetic field sensing apparatus according to claim 1, further comprising a switching circuit electrically connected to the first magnetoresistance units and the second magnetoresistance units, wherein the at least one kind of Wheatstone full bridge is two kinds of Wheatstone full bridge, the switching circuit respectively electrically connects the first magnetoresistance units and the second magnetoresistance units in the two different time periods to form the two kinds of Wheatstone full bridge, and the two kinds of Wheatstone full bridge respectively measure the magnetic field components in the fourth direction and the fifth direction and respectively output the two signals corresponding to the magnetic field components in the fourth direction and the fifth direction.

12. The magnetic field sensing apparatus according to claim 1, wherein each of the first magnetoresistance units and the second magnetoresistance units comprises at least one anisotropic magnetoresistor.

13. The magnetic field sensing apparatus according to claim 12, wherein an extension direction of the anisotropic magnetoresistor belonging to the first magnetoresistance units is parallel to the second direction, and an extension direction of the anisotropic magnetoresistor belonging to the second magnetoresistance units is parallel to the first direction.

14. The magnetic field sensing apparatus according to claim 1, further comprising a substrate, wherein the magnetic field sensing device, the first magnetoresistance units, and the second magnetoresistance units are disposed on a surface of the substrate, the first direction and the second direction are parallel to the surface, and the third direction is perpendicular to the surface.

15. The magnetic field sensing apparatus according to claim 14, wherein the substrate is a semiconductor substrate, a glass substrate, or a circuit substrate.

16. The magnetic field sensing apparatus according to claim 1, wherein the first direction, the second direction, and the third direction are perpendicular to each other, the fourth direction is perpendicular to the fifth direction, and the fourth direction has an included angle of 45 degrees with both the first direction and the second direction.

* * * * *